United States Patent [19]

Baker et al.

[11] 4,310,800

[45] Jan. 12, 1982

[54] DIGITAL FREQUENCY MEASURING CIRCUITRY

[75] Inventors: Benjamin H. Baker, Davison; David W. Taylor, Grand Blanc, both of Mich.

[73] Assignee: General Motors Corporation, Detroit, Mich.

[21] Appl. No.: 92,434

[22] Filed: Nov. 7, 1979

[51] Int. Cl.³ ............................................ G01R 23/02
[52] U.S. Cl. .............................. 324/78 D; 235/92 FQ
[58] Field of Search ............... 235/92 FQ; 324/78 D, 324/79 D

[56] References Cited

U.S. PATENT DOCUMENTS

| | | | |
|---|---|---|---|
| 3,818,342 | 6/1974 | Stevens | 235/92 FQ |
| 3,857,107 | 12/1974 | Lieberman | 235/92 FQ |
| 3,922,670 | 11/1975 | Shaw | 235/92 FQ |
| 3,997,764 | 12/1976 | Belmonte | 324/78 D |

*Primary Examiner*—Michael J. Tokar
*Attorney, Agent, or Firm*—Albert F. Duke

[57] ABSTRACT

Digital frequency measuring circuitry is disclosed which includes a first shift register, the content of which is increased by a fixed amount at the beginning of each cycle of the input signal to be measured. Thereafter the content of the first register is caused to exponentially decay until the next input cycle is detected where the process is repeated. At the beginning of each cycle of the input signal, the content of the first register is transferred to a second or memory register where the data is used to drive a gage or other output device. To improve gage performance during low frequency input the memory register is also updated whenever the content of the first register is less than the content of the memory register. Also, if the input signal is removed any significant residual in the first register is eliminated by decrementing the first register to insure that the gage accurately represents the input condition.

7 Claims, 4 Drawing Figures

DIGITAL FREQUENCY MEASURING CIRCUITRY

FIELD OF THE INVENTION

This invention relates to circuitry for measuring the frequency of an input signal and, more particularly, to digital circuitry for measuring the frequency of relatively low information rate input signals.

BACKGROUND OF THE INVENTION

Many of the automobiles manufactured today are provided with a speed transducer which includes a two-pole magnet driven by a flexible cable attached to the vehicle transmission. The magnet cooperates with a speed cup to drive an indicator needle relative to a dial to indicate the speed of the vehicle. It has been proposed to replace such mechanical speedometers with gages including a pair of coils in quadrature which respond to electrical signals to establish a resultance magnetic field which positions a pointer.

U.S. Pat. No. 4,051,434 issued Sept. 27, 1977 to Douglas W. Sweet, discloses circuitry particularly suitable for processing a relatively low information rate signal such as is often generated by a speed transducer. The patented circuitry includes a first serial shift register, the content of which is increased by a fixed amount at the beginning of each cycle of the input signal to be measured. Thereafter the content of the first register is caused to exponentially decay until the next input cycle is detected where the process is repeated. At the beginning of each cycle of the input signal, the content of the first register is transferred to a second or memory register where the data is used to drive a gage or other output device.

When the circuitry of U.S. Pat. No. 4,051,434 is used in an automobile gage application an undesirable result may occur under low speed rapid deceleration conditions or upon a total loss of information from the transducer. For example, at low speeds the memory register is updated rather infrequently due to the low frequency of the input signals. This may cause the pointer of the gage to move toward zero in undesirably large increments. In the event of loss of sensor information the memory register will not be updated and accordingly the gage will register the speed corresponding to that prevailing at the time of sensor loss.

SUMMARY OF THE INVENTION

With the foregoing in mind, it is an object of the present invention to provide an improved digital frequency measuring circuit which alleviates the aforementioned poor gage pointer performance at low speed. In accordance with the present invention, circuitry is provided for continually comparing the content of the aforementioned first and second registers and in addition to the usual update each cycle of the input signal, the second or memory register is updated with the content of the first register whenever the content of the first register is less than the content of the second register.

A more complete understanding of the present invention may be had from the following detailed description which should be read in conjunction with the drawings, in which:

DESCRIPTION OF THE PREFERRED EMBODIMENT

Figure 1:
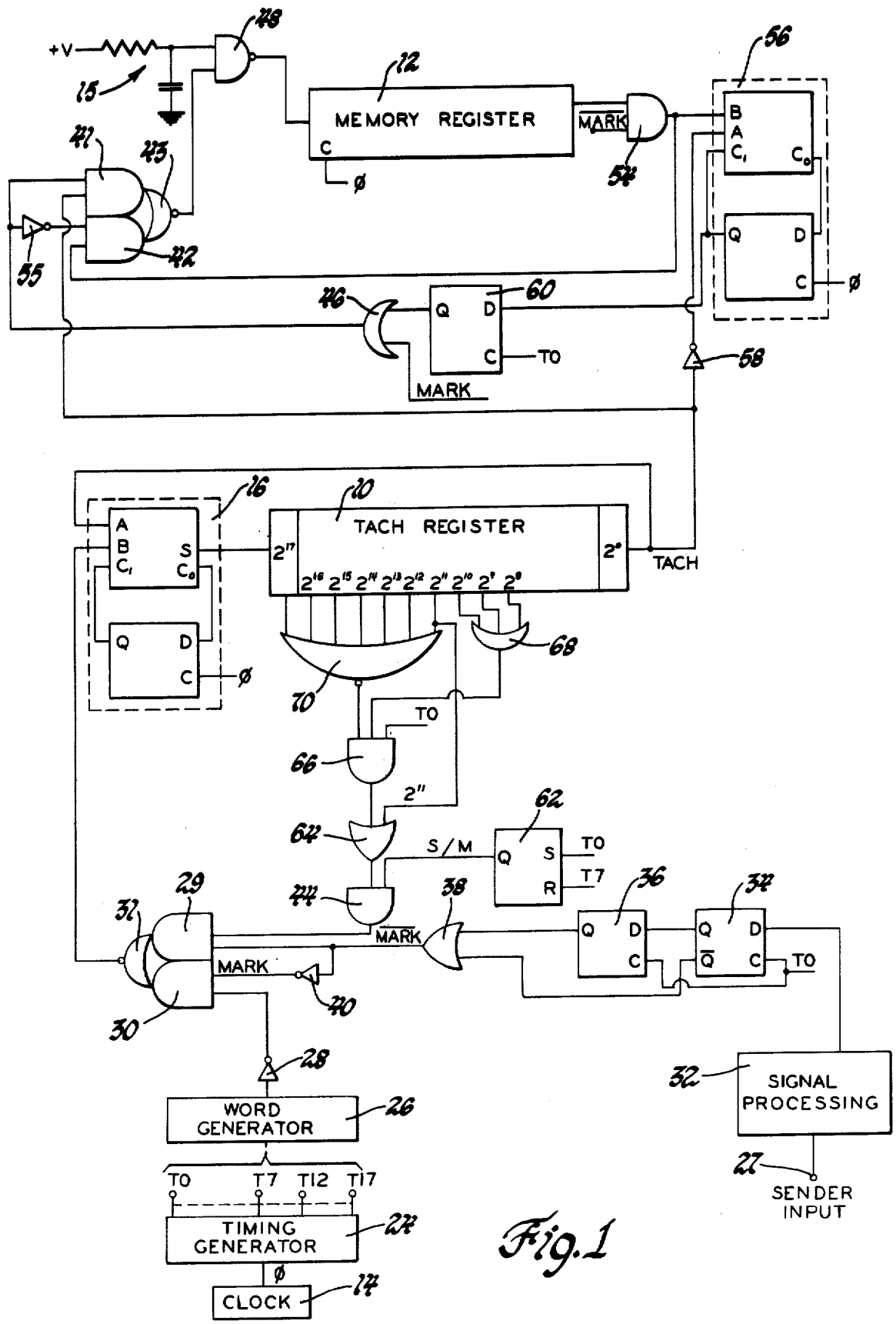
FIG. 1 is a block diagram of the frequency measuring circuitry.
Figure 2:
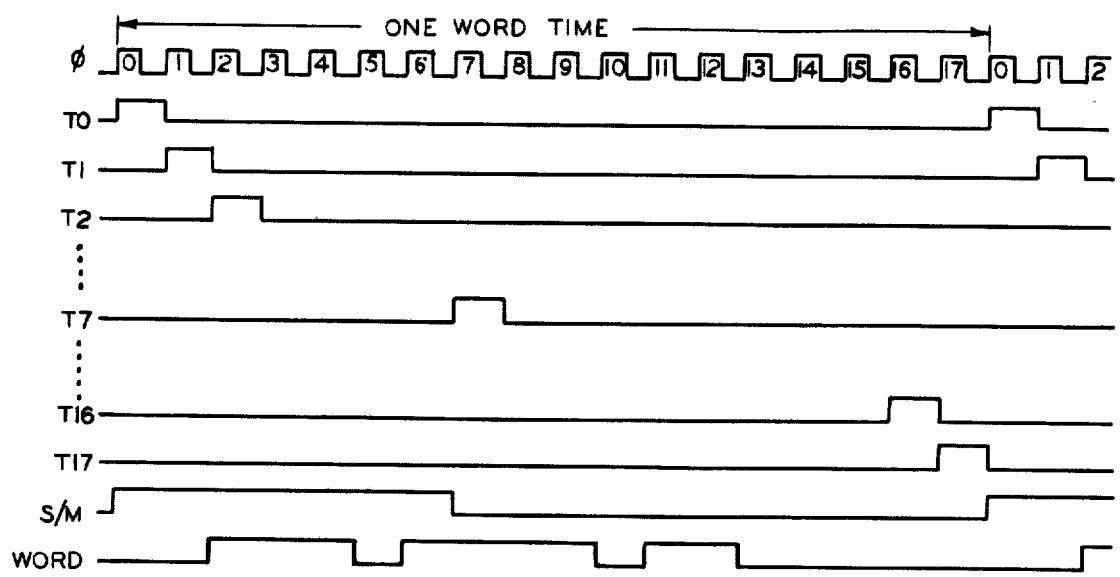
FIGS. 2 and 3 are timing waveforms.
Figure 3:
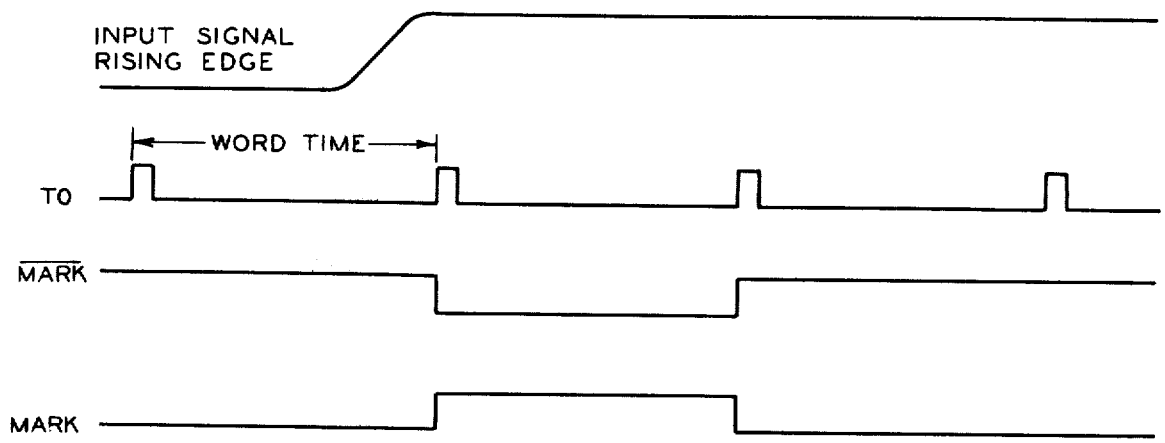

Referring now to the drawings and initially to FIG. 1, the frequency measuring circuitry of the present invention comprises two 18 bit shift registers 10 and 12. Data is serially shifted through the registers 10 and 12 at approximately a 132 KHz rate by a clock signal $\phi$ from a clock 14. The register 12 is initialized on power up from an R-C network 15. The output of the register 10 is fed back to its input through the A port of a full adder generally designated 16 which performs arithmetical operations on the content of register 10. The clock 14 drives a timing generator generally designated 24 which produces timing signals T0–T17, several of which are shown in FIG. 2. Each of the signals T0–T17 repeat each 18 clock cycles which establishes a word time interval. A word generator generally designated 26 responds to the waveforms T0–T12 to generate an 18 bit binary word to be added to the content of the register 10 each cycle of the input signal being measured. A typical word corresponding to the digital number 7132 produced by ORing T2–T4, T6–T9 and T11–T12 is shown in FIG. 2. As shown in FIG. 3, a signal designated MARK is generated on the rising edge of T0 following an input signal applied to the input terminal 27. The input signal is applied through signal processing circuitry generally designated 32 which produces a substantially square wave signal. The output of the circuitry 32 is applied to the D input of flip-flop 34 having its Q output connected with the D input of a flip-flop 36. The clock inputs of the flip-flops 34 and 36 are tied to T0. The $\overline{Q}$ output of the flip-flop 34 and the Q output of the flip-flop 36 provide inputs to an OR gate 38, the output of which is designated $\overline{\text{MARK}}$ and which is inverted by an inverter 40 to produce the signal MARK. Thus, MARK and $\overline{\text{MARK}}$ are one word time interval and occur during the first word time of the input signal.

The output of the generator 26 is inverted by an inverter 28 and applied to AND/OR/INVERT logic comprising gates 29, 30 and 31. When MARK is high, the gate 30 is enabled to pass $\overline{\text{WORD}}$ to the B input of the adder 16. The addition of TACH and $\overline{\text{WORD}}$ along with the carry-in from the previous operation effectively adds the constant from the word generator 26 to the content of the register 10. Also, while MARK is high, the output of register 10 designated TACH is loaded into the memory register 12 through gate 48 and AND/OR/INVERT logic comprising gates 41, 42 and 43. Gate 41 is enabled from MARK through the gate 46 while the gate 42 is disabled through the inverter 55. Thus, during the first word time following the rising edge of an input signal, the memory register is updated with the content of the register 10 and the content of the register 10 is increased by a predetermined number generated from the word generator 26.

Figure 4:
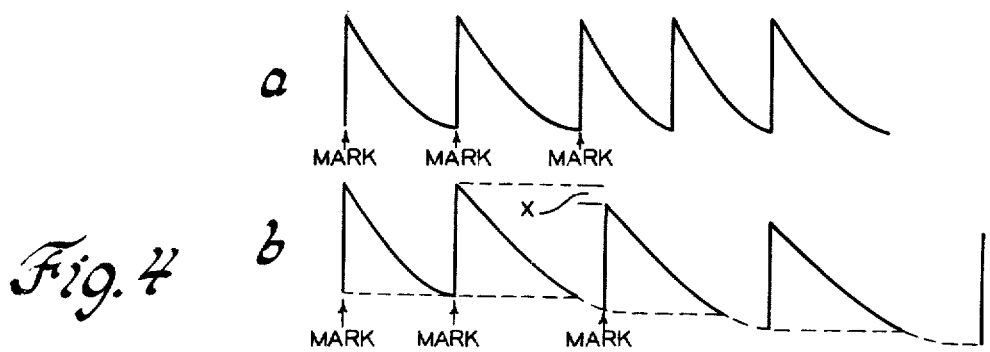
FIGS. 4a and 4b are graphs which are useful in understanding the invention.

During subsequent word time intervals of the input signal MARK is low and $\overline{\text{MARK}}$ is high. With $\overline{\text{MARK}}$ high, the gates 42 and 54 are enabled causing the content of the memory register 12 to be recirculated from its output to its input. Also, during each subsequent word time interval, the seven most significant bits of the register 10 are routed from the 2" output of register 10 through OR gate 64 to AND gate 44. The AND gate 44 is enabled by a signal designated S/M, as shown in FIG. 2, which is generated from a flip-flop 62. The flip-flop 62 is set by the rising edge of T0 and reset by the rising edge of T7. The gate 44 is thus enabled during the first seven bit times of each word time. When $\overline{MARK}$ is high, the gate 29 is enabled so that the upper seven bits of the register 10 are inverted by the gate 31 and applied to the B input of the adder 16 where they are subtracted from the least significant seven bits of the register 10. This operation causes the content of the register 10 to exponentially decay. FIG. 4a is an analog representation of the content of the register 10 at steady state, i.e., a constant frequency input signal. As shown in FIG. 4a, the content of the register increases by the amount of the binary word from the generator 26 during each MARK word time interval and decreases exponentially between MARK word time intervals.

The circuitry of FIG. 1 thus far described is essentially that shown in the aforementioned U.S. Pat. No. 4,051,434. In the patented circuitry the register 12 is updated only upon the occurrence of MARK. Consequently, it will be noted from FIG. 4b that with a decreasing input frequency an instantaneous change, designated X, will occur when the content of the register 12 is updated. When the register 12 is being used to position the pointer of a tachometer or speedometer, the effect can be rather noticeable at low input frequencies, for example below 5 mph. Moreover, if for any reason the input signal is lost, such as for example in the speedometer application where the vehicle wheels lock on ice, no MARK signals will be generated and the pointer will remain positioned at the value loaded into the register 12 during the previous MARK time.

To alleviate this condition, the output of the register 10 is continuously compared with the content of the register 12 by a full adder 56 having its B input connected with the output of the gate 54 and its A input connected with the output of the register 10 through an inverter 58. The adder 56 performs a 2's complement addition, i.e., subtraction of the content of the register 10 from the register 12. If the register 12 content is greater than the register 10 content, a carry-out is generated from the adder 56 and applied to the D input of flip-flop 60. Under these conditions, i.e., register 12 content greater than register 10 content, each T0 the gate 41 is enabled from the Q output of flip-flop 60 through gate 46 to update the register 12 with the content of the register 10. This causes the register 12 content to follow the register 10 content whenever the register 10 content falls below the register 12 content. This has the effect of causing the needle of a speedometer or tachometer to move slowly from one speed indication to a lower speed indication under low speed conditions. The effective load of the register 12 in FIG. 4b is shown by the dotted line.

As disclosed in copending application Ser. No. 022,822, filed Mar. 22, 1979, and assigned to the assignee of the present invention, the upper ten bits of the register 12 may be used to position the speedometer or tachometer needle. Since the upper seven bits are used to exponentially decay the content of the register 10, when these bits are all zero, no further decay can occur. Depending upon the scaling and the value of bits $2^8$–$2^{10}$, the pointer may in fact indicate a low speed value, for example 2 mph when the vehicle is stopped. To overcome this problem a NOR gate 70 enables an AND gate 66 whenever the upper seven bits are zero. This enables the signal T0 to pass through the gates 64, 44, 29 and 31 where it is inverted and applied to the B input of the adder 16. This presents an 18 bit word consisting of a zero followed by 17 ones. The carry-in from the previous operation, which will normally be present, effectively causes 18 ones to be added to the content of the register 10 which causes its content to be decremented by one. This decrementing of the register 10 continues until bits $2^8$–$2^{10}$ are all zero, at which time gate 68 disables the gate 66. The potentially substantial residue represented by bits $2^8$–$2^{10}$ is thus eliminated resulting in a zero speed indication when the vehicle is stationary.

Having thus described our invention what we claim is:

1. Digital frequency measuring circuitry for developing a binary word proportional to the frequency of an input signal comprising, a first shift register means, a second shift register means, timing means establishing a word time interval substantially less than the interval of said input signal, means responsive to said timing means for updating the content of said second register means with the content of said first register means each cycle of said input signal, means for increasing the content of said first register means by a predetermined amount during one word time interval each cycle of said input signal, means for decreasing the content of said first register means during subsequent word time intervals of said input signal by an amount proportional to the content of said first register means, means for comparing the content of said first register means and second register means each word time interval and for updating the content of said second register means with the content of said first register means if the content of said second register means is greater than the content of said first register means.

2. Digital frequency measuring circuitry for developing a binary word proportional to the frequency of an input signal comprising, a first shift register means, a second shift register means, timing means establishing a word time interval substantially less than the interval of said input signal, means responsive to said timing means for updating the content of said second register means with the content of said first register means each cycle of said input signal, means for increasing the content of said first register means by a predetermined amount during one word time interval each cycle of said input signal, means for subtracting a predetermined number of the most significant bits of said first register from a corresponding number of the least significant bits of said first register to decrease the content of said first register by a predetermined proportional amount, means responsive to said most significant bits being a zero binary number for decrementing the content of said first register until a predetermined greater number of the most significant bits are zero, means for comparing the content of said first register means and second register means each word time interval and for updating the content of said second register means with the content of said first register means if the content of said second register means is greater than the content of said first register means.

3. A method of developing a binary word indicative of the frequency of an input signal comprising the steps of adding a predetermined amount to the word each cycle of the input signal and reducing the value of the word by a predetermined portion of its present value at periodic intervals during each cycle of the input signal, transferring the word to a storage means at the end of each cycle of the input signal or whenever the value of the word is reduced below the value of the previously transferred word.

4. A method of developing a binary word indicative of the frequency of an input signal comprising the steps of
adding a predetermined amount to the word each cycle of the input signal and reducing the value of the word by a predetermined portion of its present value at periodic intervals during each cycle of the input signal,
transferring the word to a storage means at the end of each cycle of the input signal or whenever the value of the word is reduced below the value of the previously transferred word,
and decrementing the value of the word when a predetermined number of the most significant bits of the word is zero.

5. Digital frequency measuring circuitry comprising means responsive to an input signal for developing, during periodic intervals of each cycle of the input signal, a code word which at the end of each cycle of the input signal is proportional to the frequency of the input signal, a memory register, means for comparing the code word developed each interval with the content of said memory register, means for loading said memory register with the code word developed during any interval following an interval in which the code word is less than the content of said memory register.

6. Digital frequency measuring circuitry comprising means responsive to an input signal for developing, during each cycle of the input signal, a bindary word which at the end of each cycle of the input signal is proportional to the frequency of the input signal, a memory register, means for comparing the content of said memory register with said binary word at periodic intervals of the development of said binary word and providing a gating signal if said binary word is less than the content of said memory register, and means responsive to the end of each cycle of the input signal for transferring the binary word developed during the previous periodic interval to said memory register, said last mentioned means also responsive to said gating signal for transferring the binary word developed during the next periodic interval to said memory register whereby the content of said memory register is updated more often when the frequency of said input signal is declining.

7. Digital frequency measuring circuitry responsive to an input signal for developing a binary word proportional to the frequency of the input signal comprising a computation register, arithmetic and logic means responsive to said input signal for adding a predetermined amount to the content of said register each cycle of said input signal and for reducing the content of said register, at predetermined fixed time intervals substantially less than the time interval between cycles of the input signal, either by a number corresponding to the value of a predetermined number of the most significant bits of the word residing in the register or by decrementing the content of said computation register if said predetermined bits are zero, a memory register, means for updating said memory register with the content of said computation register at least once each cycle of said input signal as well as whenever the content of said computation register is less than the content of said memory register.

* * * * *